(12) United States Patent
Itagaki et al.

(10) Patent No.: US 8,679,650 B2
(45) Date of Patent: Mar. 25, 2014

(54) SUBSTRATE FOR GROWING WURTZITE TYPE CRYSTAL AND METHOD FOR MANUFACTURING THE SAME AND SEMICONDUCTOR DEVICE

(75) Inventors: Naho Itagaki, Yokohama (JP); Tatsuya Iwasaki, Machida (JP); Katsuyuki Hoshino, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 378 days.

(21) Appl. No.: 12/571,499

(22) Filed: Oct. 1, 2009

(65) Prior Publication Data

US 2010/0092800 A1 Apr. 15, 2010

(30) Foreign Application Priority Data

Oct. 9, 2008 (JP) ................................ 2008-262931
Sep. 15, 2009 (JP) ................................ 2009-213725

(51) Int. Cl.
*B32B 9/04* (2006.01)
*C23C 14/34* (2006.01)

(52) U.S. Cl.
USPC ........... 428/697; 428/698; 428/701; 428/702; 204/192.15

(58) Field of Classification Search
None
See application file for complete search history.

(56) References Cited

U.S. PATENT DOCUMENTS

| 4,695,432 | A | * | 9/1987 | Colin et al. .................. 422/98 |
| 4,983,360 | A | * | 1/1991 | Merdrignac et al. ............ 422/90 |
| 5,625,202 | A | * | 4/1997 | Chai ............................... 257/94 |
| 6,716,479 | B2 | * | 4/2004 | Lu et al. ........................ 427/100 |
| 6,855,996 | B2 | | 2/2005 | Noguchi et al. ............... 257/419 |
| 6,936,854 | B2 | | 8/2005 | Iwasaki et al. ................. 257/71 |
| 6,939,731 | B2 | | 9/2005 | Ishizaki ......................... 438/22 |
| 2002/0058197 | A1 | * | 5/2002 | Nozaki et al. .............. 430/270.1 |
| 2002/0141031 | A1 | * | 10/2002 | Wang et al. .................... 359/260 |
| 2003/0146433 | A1 | * | 8/2003 | Cantwell et al. ................. 257/43 |
| 2003/0176001 | A1 | | 9/2003 | Fukuyama et al. ............. 438/22 |
| 2004/0104392 | A1 | * | 6/2004 | Ishizaki ......................... 257/79 |
| 2005/0156496 | A1 | * | 7/2005 | Takashima et al. ........... 313/237 |
| 2006/0051554 | A1 | | 3/2006 | Kumakura et al. ............. 428/98 |
| 2006/0102907 | A1 | * | 5/2006 | Lee et al. ........................ 257/72 |
| 2006/0108587 | A1 | * | 5/2006 | Lee et al. ........................ 257/72 |
| 2006/0118788 | A1 | * | 6/2006 | Park ............................... 257/72 |
| 2006/0283833 | A1 | * | 12/2006 | Lee et al. ........................ 216/23 |
| 2007/0002251 | A1 | * | 1/2007 | Chang et al. .................. 349/141 |
| 2007/0004102 | A1 | | 1/2007 | Dairiki et al. ................. 438/149 |
| 2010/0109002 | A1 | * | 5/2010 | Itagaki et al. ................... 257/43 |

FOREIGN PATENT DOCUMENTS

| JP | 6-196757 | 7/1994 |
| JP | 6196757 A | 7/1994 |
| KR | 2005-0014344 | 2/2005 |

(Continued)

OTHER PUBLICATIONS

Picard et al Sensors and Actuators. B42, 1997, 47-51.*

(Continued)

*Primary Examiner* — Vera Katz
(74) *Attorney, Agent, or Firm* — Fitzpatrick, Cella, Harper & Scinto

(57) ABSTRACT

A laminated structure comprises a first layer comprising a crystal with six-fold symmetry, and a second layer comprising a metal oxynitride crystal formed on the first layer The second layer comprises at least one element selected from the group consisting of In, Ga, Si, Ge and Al, N, O and Zn, as main elements, and has in-plane orientation.

10 Claims, 9 Drawing Sheets

(56) References Cited

FOREIGN PATENT DOCUMENTS

| KR | 2005-014344 | 2/2005 |
|---|---|---|
| KR | 2008-0011730 | 2/2008 |
| WO | WO 2005/062394 A1 | 7/2005 |
| WO | WO2008133345 * | 11/2008 |

OTHER PUBLICATIONS

W. Luo et al., "Stable response to visible light of InGaN photoelectrodes," Applied Physics Letters, vol. 92, pp. 262110-1-262110-3, Jul. 3, 2008.

T. Ushiyama et al., "Energy relaxation time of hot carriers photoexcited in InGaN," physica status solidi (c), vol. 5, No. 1, pp. 143-145, 2008.

N. Li et al., "Growth of InGaN with High Indium Content on ZnO Based Sacrificial Substrates," Seventh International Conference on Solid State Lighting, Proceedings of the SPIE, vol. 6669, pp. 66690X-1-66690X-7, 2007.

OA issued Nov. 29, 2011 by Korea Patent Office in counterpart application 10-2009-0095436 (in translation).

Office Action issued Sep. 24, 2012, in counterpart Korean Patent Application No. 10-2009-0095436 (with translation).

Extended European Search Report issued Jan. 23, 2013 in EPO counterpart application 09012656.6.

* cited by examiner

○ In, Ga, Si, Ge, OR Al

● N OR O

SUBSTRATE FOR GROWING WURTZITE TYPE CRYSTAL AND METHOD FOR MANUFACTURING THE SAME AND SEMICONDUCTOR DEVICE

BACKGROUND OF THE INVENTION

1. Field of the Invention

The present invention relates to substrate for growing a wurtzite-type crystal comprising a laminated structure a first layer of which includes a crystal with six-fold symmetry, which wurtzite-type crystal exemplifies, and a second layer of which includes a metal oxynitride crystal, and a method for manufacturing the same, and a semiconductor device.

2. Description of the Related Art

In recent years, attention has been paid to a light receiving and emitting element using an InGaN-based semiconductor because it is considered that when an InGaN nitride semiconductor is used as a light receiving and emitting element, light can be received and emitted in a very wide band, from the ultraviolet region to the infrared region because the optical band gap of InN is 0.7 eV (in the infrared region), and the optical band gap of GaN is 3.4 eV (in the ultraviolet region). Also, because of the small electron effective mass, high-frequency operation can be expected, also, when application to an electronic device is considered. From the above background, research and development on InGaN have become active in recent years. These related techniques are described in, for example, Japanese Patent No. 2751963, *Applied Physics Letters* Vol. 92, p. 262110 (2008), *Physica Status Solidi (c)* 5, No. 1, p. 143 (2008), and *Proceedings of SPIE*, Vol. 6669, p. 66690X (2007).

However, there is a problem that no crystal substrate lattice-matched with InGaN, which is a wurtzite-type crystal, exists. A method in which, as in GaN, sapphire ($Al_2O_3$) is used as a substrate, and InGaN is directly grown on sapphire is used, but the crystallinity of the obtained film is low. Therefore, Japanese Patent No. 2751963 and *Applied Physics Letters* Vol. 92, p. 262110 (2008) and *Physica Status Solidi (c)* 5, No. 1, p. 143 (2008), propose a method in which first, a GaN layer is grown on sapphire, and then, InGaN growth is performed. In the above method, InGaN is grown after the GaN layer is grown, and therefore, there is an advantage that the formation of a rotation domain in the growth plane is suppressed, so that high crystallinity is obtained.

However, the a-axis lattice constant of GaN and InN is 0.3189 nm and 0.3548 nm respectively and since these values are quite different, any high-quality InGaN obtained so far is only of a Ga-rich composition. Various factors can be considered for this, and one factor is that when InGaN is grown on GaN, due to a Ga composition drawing-in effect (an effect that In atoms are not easily taken in to decrease the lattice mismatch with the GaN substrate layer) at the early stage of growth, it is difficult to obtain a crystal having a lattice constant largely different from that of the substrate layer.

Therefore, in *Proceedings of SPIE* Vol. 6669, p. 66690X (2007), an attempt to form InGaN on a ZnO substrate is made because ZnO has a larger lattice constant than GaN, and a small lattice mismatch with InGaN. But, the composition of In completely lattice-matched with ZnO is In/(In+Ga)=18 atomic %, and it is still difficult to form an In-rich, high-quality InGaN film.

The present invention solves the above problems, and it is an object of the present invention to provide a substrate for growing a wurtzite-type crystal comprising a laminated structure having the desired lattice constant and excellent crystallinity, and a method for manufacturing the same. Also, it is another object of the present invention to provide a semiconductor device using the above substrate for growing a wurtzite-type crystal comprising a laminated structure.

SUMMARY OF THE INVENTION

In order to achieve the above objects, the present inventors have paid attention to a laminated structure of a metal oxynitride crystal and a wurtzite-type crystal, and studied diligently. As a result, the present invention has been completed.

The present invention is directed to a substrate for growing a wurtzite-type crystal comprising a laminated structure a first layer of which comprises a crystal with six-fold symmetry and a second layer of which comprises a metal oxynitride crystal formed on the first layer, where the second layer comprises at least one element selected from the group consisting of In, Ga, Si, Ge and Al, N, O and Zn, as main elements, and where the second layer has in-plane orientation.

The first layer can be a wurtzite-type crystal or $Al_2O_3$ crystal. The second layer can be a crystal of wurtzite type.

The a-axis lattice constant of the second layer can be in the range of 0.320 nm to 0.358 nm The FWHM of an X-ray rocking curve of the (002) plane of the second layer can be 1 degree or less.

The first layer can comprise a wurtzite-type crystal selected from the group consisting of GaN and ZnO, where the second layer comprises $Zn_{(x)}In_{(1-x)}O_{(y)}N_{(1-y)}$ with $0.1 \leq x \leq 0.9$ and $0.1 \leq y \leq 0.9$.

The first layer can comprise an $Al_2O_3$ crystal, where the second layer comprises $Zn_{(x)}In_{(1-x)}O_{(y)}N_{(1-y)}$ with $0.1 \leq x \leq 0.9$ and $0.1 \leq y \leq 0.9$.

The present invention is directed to a semiconductor device using a substrate for growing the wurtzite-type crystal as a substrate.

The present invention is directed to a method for manufacturing a substrate for growing a wurtzite-type crystal comprising a laminated structure, which comprises the step of forming a second layer comprising a metal oxynitride crystal having in-plane orientation on a first layer comprising a crystal with six-fold symmetry, in an atmosphere comprising nitrogen, where the second layer comprises at least one element selected from the group consisting of In, Ga, Si, Ge and Al, N, O and Zn, as main elements.

The second layer can be formed by sputtering.

The film deposition rate of the second layer can be 10 nm/min or less.

According to the present invention, it is possible to provide a substrate for growing a wurtzite-type crystal substrate for growing a wurtzite-type crystal having the desired lattice constant and excellent crystallinity at low cost.

Further, it is possible to provide a semiconductor device, such as a high-speed transistor and diode, and a high-efficiency light receiving element and light emitting element, using the substrate for growing a wurtzite-type crystal comprising a laminated structure.

Further features of the present invention will become apparent from the following description of exemplary embodiments with reference to the attached drawings.

DESCRIPTION OF THE EMBODIMENTS

First, circumstances in which the present invention has been completed will be described before the embodiment of the present invention will be described.

The present inventors have paid attention to the fact that ZnO has a wurtzite-type crystal structure as in nitrides, such as InN, GaN and AlN, and have tried to make films of metal oxynitrides that are mixed crystals of ZnO and the above nitrides. As a result, it has been found that any of the metal oxynitride films exhibits a crystal structure having a (001)-oriented (c-axis-oriented) wurtzite-type atomic arrangement.

Figure 1:
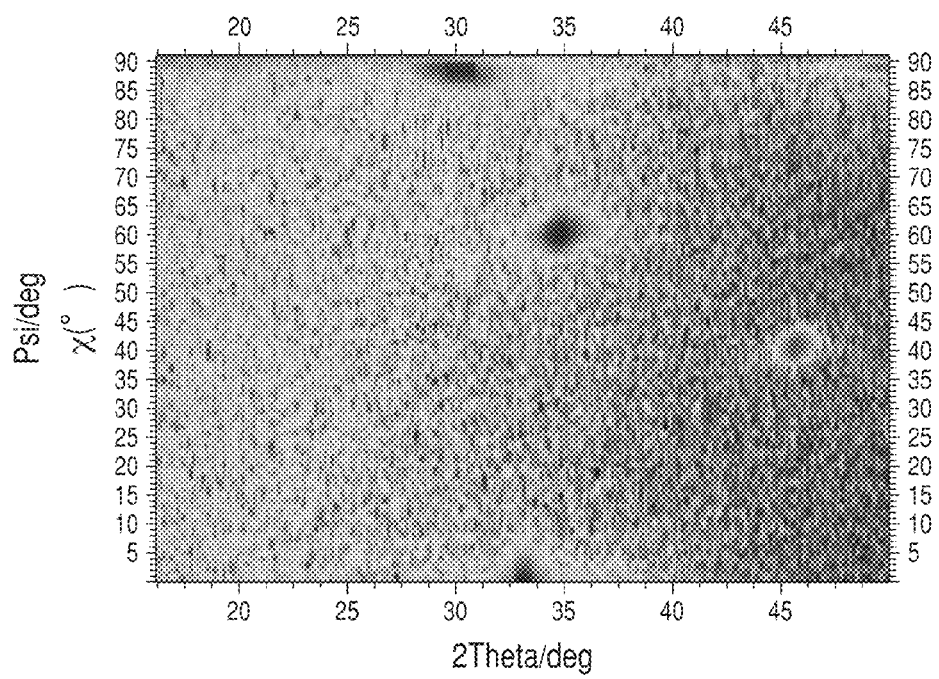
FIG. 1 illustrates a typical two-dimensional X-ray diffraction pattern of a metal oxynitride crystal of wurtzite type.
Figure 2:
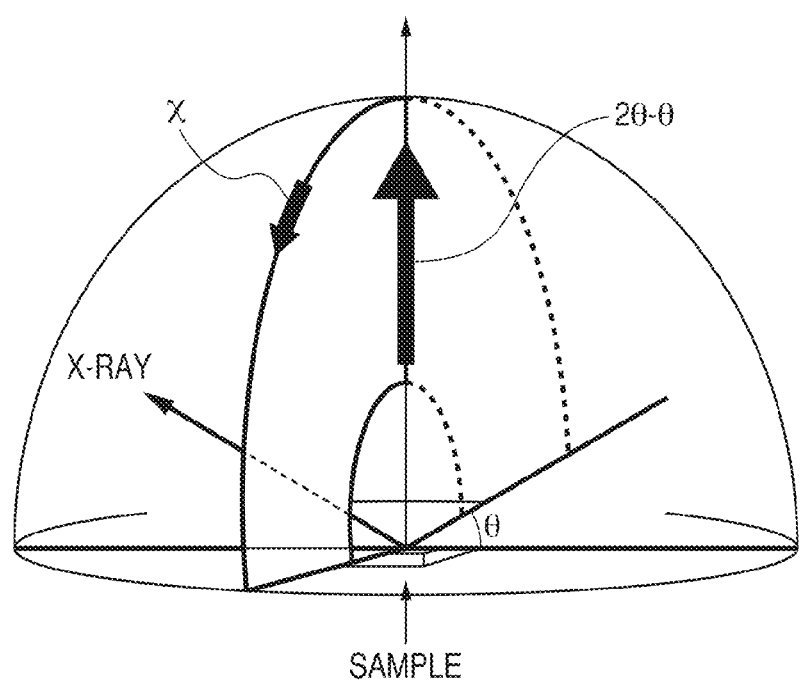
FIG. 2 is a diagram illustrating a geometric arrangement during two-dimensional X-ray diffraction pattern measurement.

FIG. 1 illustrates a typical two-dimensional X-ray diffraction pattern of the metal oxynitride film. Here, the two-dimensional X-ray diffraction pattern is obtained by repeating q–2q measurement (where q is the X-ray incident angle) while tilting the sample, and connecting the diffraction intensity, and the phase identification of an oriented film is possible. In FIG. 1, the horizontal axis represents 2q, and the vertical axis represents a substrate tilt angle x. FIG. 2 illustrates a diagram of the geometric arrangement of X-ray diffraction. In FIG. 2, the arrow 2θ-θ represents a scattering vector.

As illustrated in FIG. 1, a diffraction peak is observed around 2q=30 to 35 degrees, when χ (substrate tilt angle) is near 0 degree, around 2q=56 to 64 degrees (not illustrated), when χ is near 32 degrees,
around 2q=43 to 48 degrees, when χ is near 43 degrees,
around 2q=33 to 37 degrees, when χ is near 62 degrees,
around 2q=29 to 32 degrees, when χ is near about 90 degrees, and
around 2q=52 to 58 degrees (not illustrated), when χ is near about 90 degrees, depending on the composition of the metal oxynitride.

Figure 3:
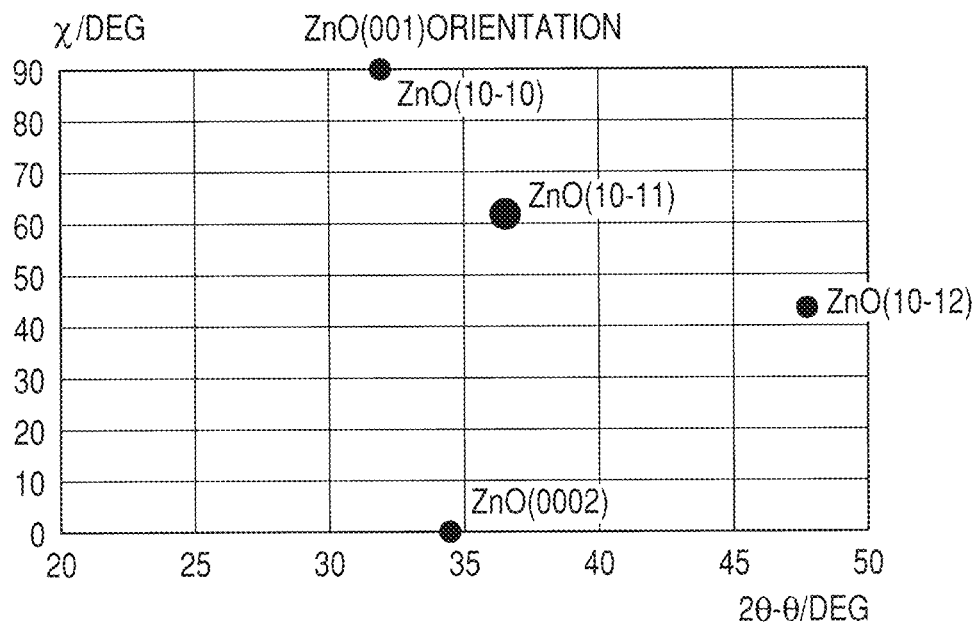
FIG. 3 illustrates the simulation result of the two-dimensional X-ray diffraction pattern of the wurtzite-type structure ZnO.
Figure 4:
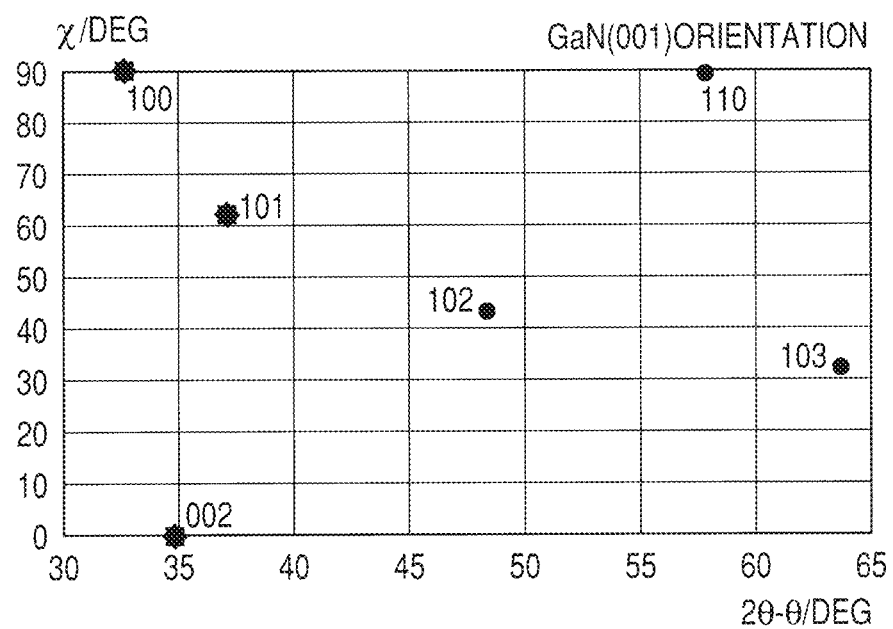
FIG. 4 illustrates the simulation result of the two-dimensional X-ray diffraction pattern of the wurtzite-type structure GaN.

The observed diffraction peaks show a pattern similar to those of the simulation results of ZnO and GaN having a (001)-oriented wurtzite structure (FIG. 3 and FIG. 4).

Figure 5:
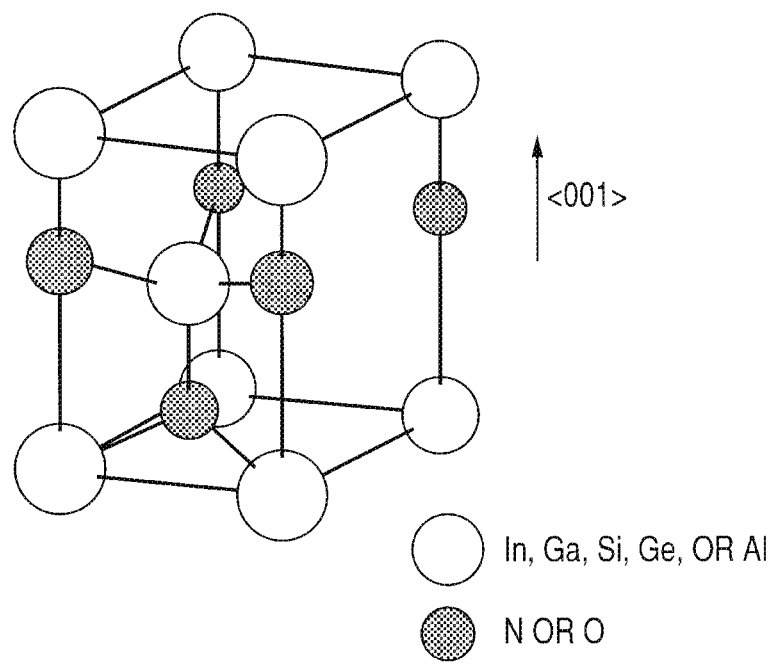
FIG. 5 is a diagram illustrating the atomic arrangement of a wurtzite-type structure.

From this, it is found that the entire thin film is formed of an oxynitride having the atomic arrangement of a (001)-oriented wurtzite-type structure as illustrated in FIG. 5. In the present invention, a crystal structure having the atomic arrangement of a wurtzite-type structure corresponds to a pattern similar to that of the wurtzite-type structure as described above being obtained in two-dimensional X-ray diffraction.

Next, the present inventors have paid attention to the crystal structure of $ZnGeN_2$ and $ZnSiN_2$ and have tried to make metal oxynitride films including mixed crystals of $ZnGeN_2$ and $ZnSiN_2$ and ZnO, because although the crystal structure of $ZnGeN_2$ and $ZnSiN_2$ is classified into an orthorhombic system, $ZnGeN_2$ and $ZnSiN_2$ have a structure, in which each N atom is surrounded by a tetrahedron including two of Ge and two of Zn, or two of Si and two of Zn, and have a structure similar to a wurtzite-type structure. As a result, in two-dimensional X-ray diffraction, a pattern similar to that of the wurtzite-type structure has also been obtained for the metal oxynitride films, and it has been found that any of the metal oxynitride films has a crystal structure having a (001)-oriented wurtzite-type atomic arrangement.

Also, according to the knowledge of the present inventors, by forming these metal oxynitride films on a wurtzite-type crystal, metal oxynitride films having excellent crystallinity and aligned in-plane orientation can be formed.

Figure 6:
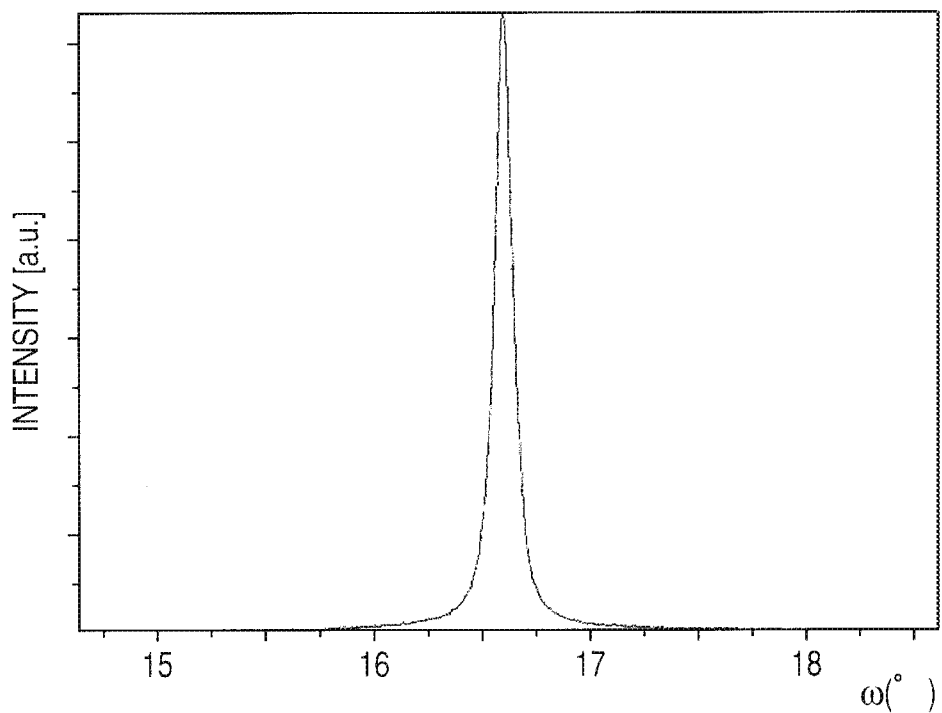
FIG. 6 illustrates a typical rocking curve of (002) plane reflection in the X-ray diffraction of a metal oxynitride film according to the present invention.

FIG. 6 illustrates a typical rocking curve of the X-ray diffraction (002) plane reflection of a metal oxynitride film in the present invention. The rocking curve is diffraction obtained by fixing a detector at a position twice an angle at which a particular crystal plane satisfies Bragg diffraction conditions, and changing the X-ray incidence angle. The degree of fluctuation in plane direction can be determined by the FWHM of the rocking curve, and it can be said that as the value of the FWHM is smaller, the crystal quality is better. In the present invention, although depending on the composition and the film manufacturing conditions, the FWHM is 1 degree or less and is small in any case, and it is found that a high-quality (001)-oriented metal oxynitride film is made.

Figure 7:
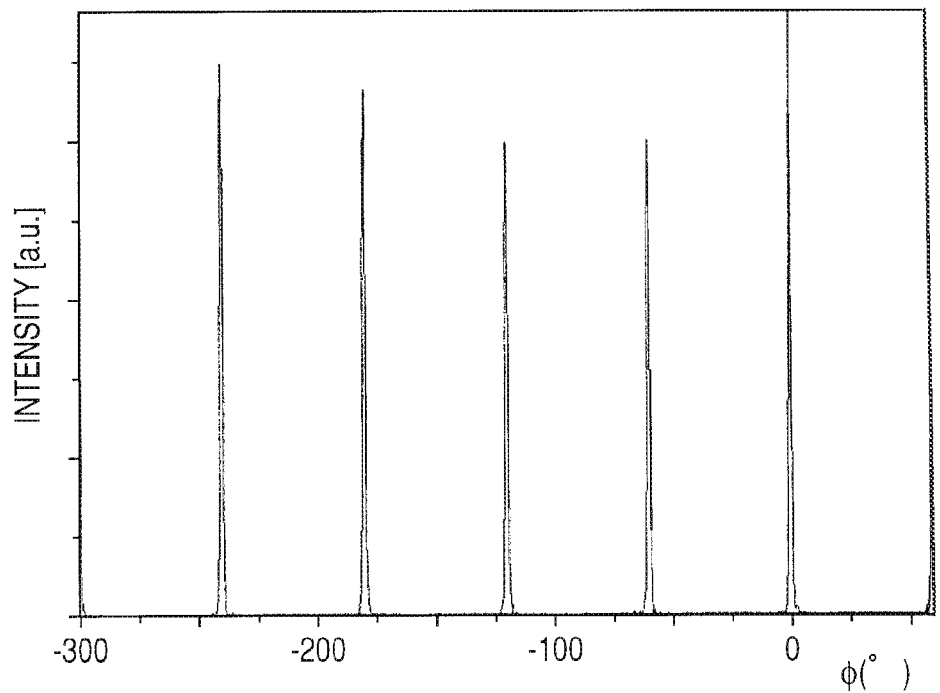
FIG. 7 illustrates the measurement result of the (101) plane φ scan of the metal oxynitride film according to the present invention.

FIG. 7 illustrates a typical example of the result of measuring the in-plane orientation of the metal oxynitride film of the present invention by φ scan. Here, the φ scan is performed by fixing a detector at the diffraction position of the (101) plane obtained from two-dimensional X-ray diffraction measurement, and rotating the sample in the in-plane direction. From FIG. 7, it is found that the diffraction peak of the (101) plane is observed at intervals of 60 degrees, so that the metal oxynitride film of the present invention has six-fold symmetry.

In the present invention, a crystal having in-plane orientation corresponds to a diffraction peak being observed at intervals of 60 degrees, as described above, in (101) plane φ scan.

Also, as a result of deriving the lattice constant of the metal oxynitride film by X-ray diffraction and transmission electron microscope (TEM) observation, it has been found that the a-axis lattice constant is in the range of 0.320 nm to 0.358 nm, depending on the composition of the metal oxynitride film.

The present invention has been made based on such knowledge.

A substrate for growing a wurtzite-type crystal comprising a laminated structure according to the embodiment of the present invention will be described below.

Figure 8:
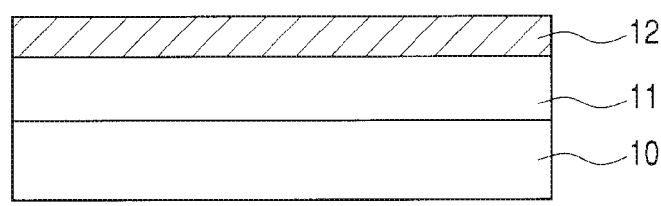
FIG. 8 illustrates a schematic diagram of a substrate for growing a wurtzite-type crystal according to the present invention.

FIG. 8 illustrates a schematic diagram of a substrate for growing a wurtzite-type crystal comprising a laminated structure in this embodiment. The laminated structure in this embodiment is formed by providing a first layer 11 including a crystal with six-fold symmetry on a substrate 10, and providing a second layer 12 including a metal oxynitride crystal on the first layer 11.

$Al_2O_3$ (aluminum oxide), GaN (gallium nitride), ZnO (zinc oxide), Si (silicon), SiC (silicon carbide), $ScAlMgO_4$ (SCAM, scandium aluminum magnesium oxide), Y-stabilized $ZrO_2$ (YSZ) and the like generally used for the growth of a wurtzite-type crystal can be used as the above substrate 10. A crystal with six-fold symmetry, for example, Al2O3 GaN, ZnO, InN (indium nitride), AlN (aluminum nitride), Si, SiC, SCAM, YSZ and films in which these are laminated may be used as the first layer 11, and particularly, a wurtzite-type crystal or $Al_2O_3$ can be used. According to the study of the present inventors, when GaN and ZnO are used as the first layer 11, the crystallinity of the second layer 12 formed on the first layer 11 is high. Particularly, the crystallinity of the second layer 12 is very high when GaN and ZnO are used as the first layer.

Figure 9:
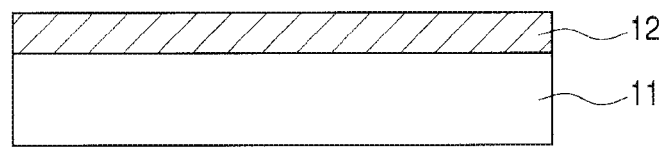
FIG. 9 illustrates a schematic diagram of a substrate for growing a wurtzite-type crystal according to the present invention.

The configuration of the substrate for growing a wurtzite-type crystal comprising a laminated structure that can be applied to the present invention is not limited to the above configuration. As illustrated in FIG. 9, the first layer 11 including, for example, GaN, ZnO, $Al_2O_3$, AlN, SiC and SCAM, may also serve as the substrate 10.

A metal oxynitride including at least one element selected from the group consisting of In, Ga, Si, Ge (germanium) and Al, N, O and Zn can be used as the second layer 12 including a metal oxynitride crystal. For example, films of metal oxynitrides, such as InZnON, GaZnON, InGaZnON, InAlZnON, SiZnON, GeZnON and InGeZnON, can be used. Here, the main elements indicate known elements in the metal oxynitride and does not include elements added to the sample. For example, ZnO to which a trace amount of In and N are added is not included in the metal oxynitride of the present invention because even if a trace amount of In and N are added to ZnO, the lattice constant is almost unchanged from that of ZnO. According to the study of the present inventors, in order to change the lattice constant, the elements should be included as main elements, specifically, at least about 5 atomic % should be included with respect to the total number of atoms in the film. On the contrary, if only the oxynitride includes the main elements, the oxynitride may include impurities to the extent of not substantially affecting the crystal structure, and may include elements, for example, Be (beryllium) and Mg.

In terms of lattice constant control, Zn, In, O and N can be included as the main elements.

Figure 10:
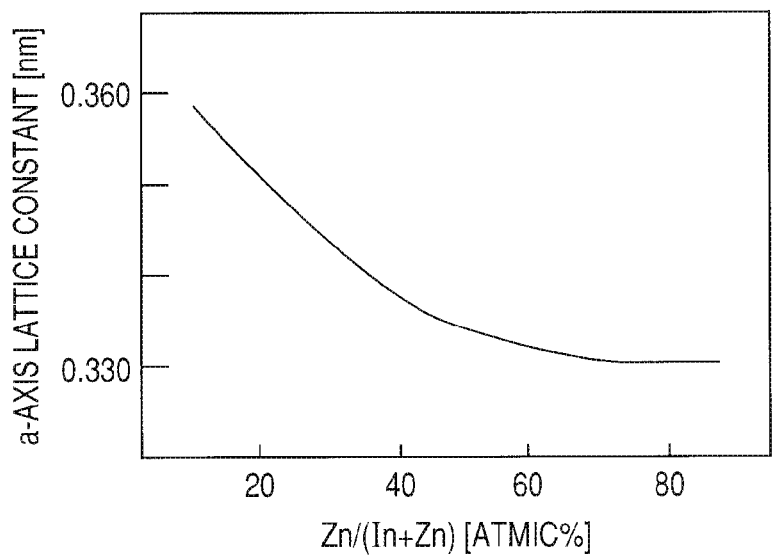
FIG. 10 is a graph illustrating the a-axis lattice constant of InZnON films at different Zn/In composition ratios.

FIG. 10 illustrates the a-axis lattice constant [nm] of InZnON films with different Zn/(In+Zn) [atomic %]. It is found that by changing Zn/(In+Zn) [atomic %], that is, a composition ratio, the a-axis lattice constant can be controlled in a wide range of about 0.330 to 0.358.

When a lattice constant smaller than the above is necessary, Ga, Zn, O and N can be included as the main elements. At this time, the a-axis lattice constant can be controlled in the range of 0.320 nm to 0.332 nm. Also, when Ge, Zn, O and N; Al, Zn, O and N; or Si, Zn, O and N are included as the main elements, the a-axis lattice constant can be controlled in the range of 0.320 nm to 0.330 nm, and such a case is a favorable form.

The lattice constant of the metal oxynitride film in the substrate for growing a wurtzite-type crystal of the present invention is variable over a wide range in this manner, so that the substrate for growing a wurtzite-type crystal can be used as, for example, a lattice-matched substrate for InGaN, InN and the like.

In a case where the above substrate for growing a wurtzite-type crystal is used for a substrate for high-quality crystal growth, when the metal oxynitride film has high crystallinity and has in-plane orientation, a film formed on the metal oxynitride film also has high crystallinity, therefore, such a metal oxynitride film is favorable. According to the study of the present inventors, in a case where a (001)-oriented metal oxynitride film is formed, when the FWHM of a peak obtained from (101) plane φ scan is 5° or less, a crystal formed on the substrate for growing a wurtzite-type crystal of the present invention has high in-plane orientation, so that high-quality crystal growth is possible. Therefore, the metal oxynitride film of the present invention can have high in-plane orientation.

Also, in the metal oxynitride crystal of the present invention, correlation between in-plane orientation and c-axis orientation is seen. For example, in a (001)-oriented metal oxynitride crystal, when the FWHM of the X-ray rocking curve of the (002) plane is 1° or less, high in-plane orientation (the FWHM of a (101) plane φ scan peak is 5 degrees or less) is obtained. In other words, in the substrate for growing a wurtzite-type crystal of the present invention, the FWHM of the X-ray rocking curve of the (002) plane of the second layer including a metal oxynitride crystal can be 1 degree or less.

Next, a method for making the substrate for growing a wurtzite-type crystal comprising a laminated structure of the present invention will be described. First, the substrate 10, such as $Al_2O_3$, GaN, ZnO, Si, SiC, SCAM and YSZ, is prepared.

Then, the first layer 11 including a crystal with six-fold symmetry is formed by one of vapor phase methods, such as metal organic chemical vapor deposition (MOCVD), molecular beam epitaxy (MBE), hydride vapor phase epitaxy (HYPE), sputtering, pulse laser deposition and electron beam deposition, and combinations thereof, and the like.

The first layer 11 having the six-fold symmetry, such as GaN, ZnO, $Al_2O_3$, SiC and SCAM, may also serve as a substrate.

Also, before the first layer 11 or second layer is formed, pretreatment, such as air annealing, vacuum annealing, hydrogen annealing, nitrogen annealing and ammonia annealing, is performed on the substrate 10 according to the constituent elements of the substrate 10 and the first layer 11 used, and the film manufacturing method. In particular, when the substrate 10 or the first layer 11 consists of $Al_2O_3$, it is preferable to carry out the hydrogen annealing or the ammonia annealing. They enable the quality of the first or second layer formed on $Al_2O_2$ to be high. It is known that in wurtzite-type crystal growth, crystallinity in cationic polarity is higher than that in anionic polarity. This is because the wurtzite-type crystal growth mode is easier to be in cationic polarity due to the annealing. The cause is not clear, but it is considered that the factor is that oxygen is reduced or etched by the annealing, so that the substrate surface is Al-richer than the stoichiometric ratio.

The temperature of the substrate 10 when the first layer 11 is formed is also similarly appropriately set according to the constituent elements of the substrate 10 and the first layer 11 used, and the film manufacturing method.

Then, the second layer 12 including a metal oxynitride crystal is formed by one of vapor phase methods, such as sputtering, pulse laser deposition, MOCVD, MBE, HYPE and electron beam deposition, and combinations thereof, and the like. The temperature of the substrate 10 can be appropriately set.

Particularly, when sputtering is used, the energy of particles entering the substrate 10 is high, so that migration on the surface of the substrate 10 is promoted, and a high-quality metal oxynitride film can be formed even at low temperature.

Particularly, when the film deposition rate is low, the above effect is remarkable. Specifically, at a film deposition rate of 10 nm/min or less, a metal oxynitride crystal having in-plane orientation can be formed even when the temperature of the substrate 10 is 300° C. or less.

Also, sputtering has an advantage that the apparatus and the running cost are more inexpensive than those of other film manufacturing methods, so that the substrate for growing a wurtzite-type crystal of the present invention can be provided at low cost.

During the formation of the metal oxynitride, a raw material gas including a N atom (for example, $N_2$, $NH_3$ and NO) is introduced into the vapor phase according to the desired concentration of nitrogen in the film. At this time, it is also effective to irradiate with N radicals using a radical source or the like, when the concentration of nitrogen in the film is desired to be increased.

Also, performing heat treatment on the manufactured oxynitride after the above step is a favorable form. The upper limit of the heat treatment temperature can be appropriately set, but can be lower than temperature at which the constituent elements of the metal oxynitride film decompose. For example, when the metal oxynitride film includes In and N, heat treatment can be performed at 550° C. or less. Thus, a metal oxynitride film having more excellent crystallinity can be formed. In order to perform heat treatment effectively, heat treatment should be performed in an atmosphere including any of nitrogen, oxygen, water vapor and carbon dioxide.

By the above, the substrate for growing a wurtzite-type crystal of the present invention can be made.

In this manner, by using the substrate for growing a wurtzite-type crystal of the present invention, a substrate having the desired lattice constant and excellent crystallinity can be provided at low cost.

Particularly, it has been difficult to form InGaN having any In composition so far because there has been no wurtzite-type substrate having a lattice constant between that of ZnO and that of InN (0.3250 nm to 0.3548 nm), but the substrate for growing a wurtzite-type crystal of the present invention solves the problem.

EXAMPLES

The present invention will be further described below, using Examples, but the present invention is not limited to these Examples.

Example 1

ZnInON/GaN/$Al_2O_3$; Zn:In=37:20

In this Example, GaN was formed on a c-plane sapphire substrate by MOCVD, and then, a ZnInON film was formed by RF sputtering in an argon-nitrogen mixed atmosphere.

First, GaN was formed on the sapphire substrate by MOCVD. In this Example, annealing in a hydrogen atmosphere at 1150 degrees was performed as substrate pretreatment. Thus, obtaining high-quality GaN formed on the substrate is possible. It is known that in GaN growth, crystallinity in Ga polarity is higher than that in N polarity. This is because the GaN growth mode is in Ga polarity due to the pretreatment. The cause is not clear, but it is considered that the factor is that oxygen is reduced or etched by the pretreatment, so that the substrate surface is Al-richer than the stoichiometric ratio.

Then, the substrate temperature was lowered to 470 degrees, and trimethylgallium (TMG) as the Ga raw material, and ammonia as the N raw material were flowed to form a 20 nm GaN low-temperature buffer layer.

Then, the temperature was raised to 1150° C., and TMG and ammonia were flowed as raw materials to grow a 5 μm high-temperature GaN layer.

When the high-temperature GaN is formed on the low-temperature buffer layer in this manner, with the buffer layer being as a nucleus, the nucleus coalesces, while growing laterally, during the formation of the high-temperature GaN, and finally, flat GaN can be obtained. Also, by the high-temperature GaN growing laterally, the threading dislocation is bent, and as a result, the dislocation density can be kept low.

When the GaN obtained by the above was observed with an atomic force microscope (AFM), the root mean square roughness (Rrms) was 0.258 nm.

Next, when the crystallinity was evaluated by X-ray diffraction, the rocking curve FWHM of (002) plane reflection was about 0.05 degree and was small, and it was found that high-quality (001)-oriented GaN was formed.

Also, when a detector was fixed at the diffraction position of the (101) plane, and in-plane orientation was measured by φ scan, the diffraction peak of the (101) plane was observed at intervals of 60 degrees, and it was found that in-plane orientation occurred. At this time, the FWHM of the diffraction peak obtained from the (101) plane φ scan was 0.15 degree.

Next, a ZnInON film was formed on the GaN. The manufacture of the ZnInON film was performed using a dual sputtering apparatus.

A two-inch sintered body having a ZnO composition and a two-inch sintered body having an In composition (each having a purity of 99.9%) were used as the targets (material sources). The input RF power was 90 W for ZnO, and 12 W for In. The distance between the targets and the substrate was about 12 cm, and the substrate temperature during film formation was 300° C. The ZnInON film was formed in an argon-nitrogen mixed gas atmosphere at $1 \times 10^{-1}$ Pa, and the partial pressure of the introduced nitrogen was $8 \times 10^{-2}$ Pa. When the obtained ZnInON film was measured by a profilometer, the film thickness was 300 nm. The composition ratio of the ZnInON film measured by Rutherford backscattering (RBS) analysis was Zn:In:O:N=37:20:29:14 (unit: atomic %). The RBS measurement precision was ±5%. Also, when the resistivity of the above ZnInON was evaluated by four-probe measurement, a value of 8 mΩcm was shown.

Comparative Example 1

ZnInON/Si (100), with Substrate Pretreatment

In this Comparative Example, a ZnInON film was formed on a Si (100) substrate. In this Comparative Example, the removal of the natural oxide film with hydrofluoric acid was performed as substrate pretreatment. The ZnInON film formation conditions were similar to those of the above Example 1.

When the obtained ZnInON film was measured by the profilometer, the film thickness was 300 nm. The composition ratio of the ZnInON film measured by RBS analysis was Zn:In:O:N=37:20:29:14 (unit: atomic %).

Comparative Example 2

ZnInON/Si (100), without Substrate Pretreatment

In this Comparative Example, a ZnInON film was formed on a Si (100) substrate. In this Comparative Example, substrate pretreatment was not performed. The ZnInON film formation conditions were similar to those of the above Example 1.

When the obtained ZnInON film was measured by the profilometer, the film thickness was 300 nm. The composition ratio of the ZnInON film measured by RBS analysis was Zn:In:O:N=37:20:29:14 (unit: atomic %).

(Crystallinity Evaluation)

When the two-dimensional X-ray diffraction pattern of the ZnInON films obtained in this Example 1 and Comparative Examples 1 and 2 was measured, a pattern similar to that of a (001)-oriented wurtzite-type structure was obtained for any of the ZnInON films, and it was found that the ZnInON films were crystals of wurtzite-type. Also, by q–2q measurement (q: X-ray incident angle), it was found that the a-axis lattice constant was about 0.331 nm.

Next, the rocking curve of (002) plane reflection was measured for the ZnInON obtained in this Example 1. As a result, the FWHM was about 0.1 degree.

FIG. 6 illustrates the rocking curve of (002) plane reflection obtained in this Example 1.

On the other hand, when the rocking curve was measured for the ZnInON obtained in Comparative Examples 1 and 2, the FWHM of (002) plane reflection was about 4.5 degrees.

Figure 12:
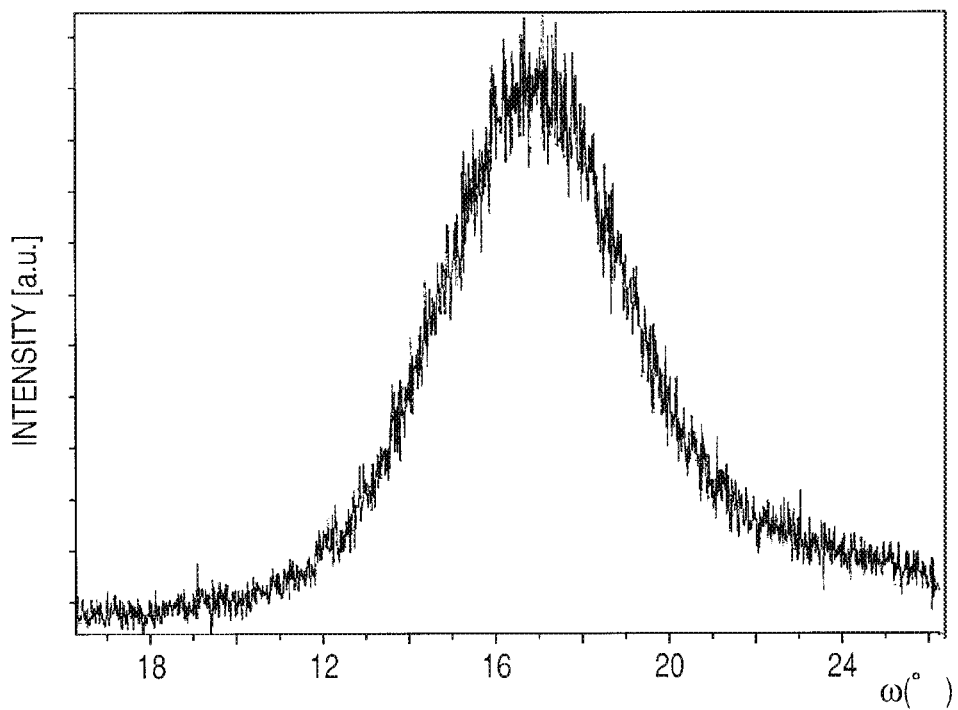
FIG. 12 illustrates the rocking curve of (002) plane reflection in the X-ray diffraction of a metal oxynitride film in Comparative Example 1.

FIG. 12 illustrates the rocking curve of the (002) plane reflection of the ZnInON film obtained in Comparative Example 1.

Also, when the detector was fixed at the diffraction position of the (101) plane of the ZnInON film in this Example, and in-plane orientation was measured by $\phi$ scan, the diffraction peak of the (101) plane was observed at intervals of 60 degrees, and in-plane orientation occurred. At this time, the FWHM of the diffraction peak obtained from the (101) plane $\phi$ scan was about 0.8 degree.

FIG. 7 illustrates the measurement result of the (101) plane $\phi$ scan obtained in this Example 1. At this time, the FWHM was 0.8 degree.

On the other hand, when the (101) plane $\phi$ scan measurement of the ZnInON films in Comparative Examples 1 and 2 was performed, diffraction was observed at any angle, without depending on $\phi$, and it was found that in-plane orientation did not occur.

Figure 13:
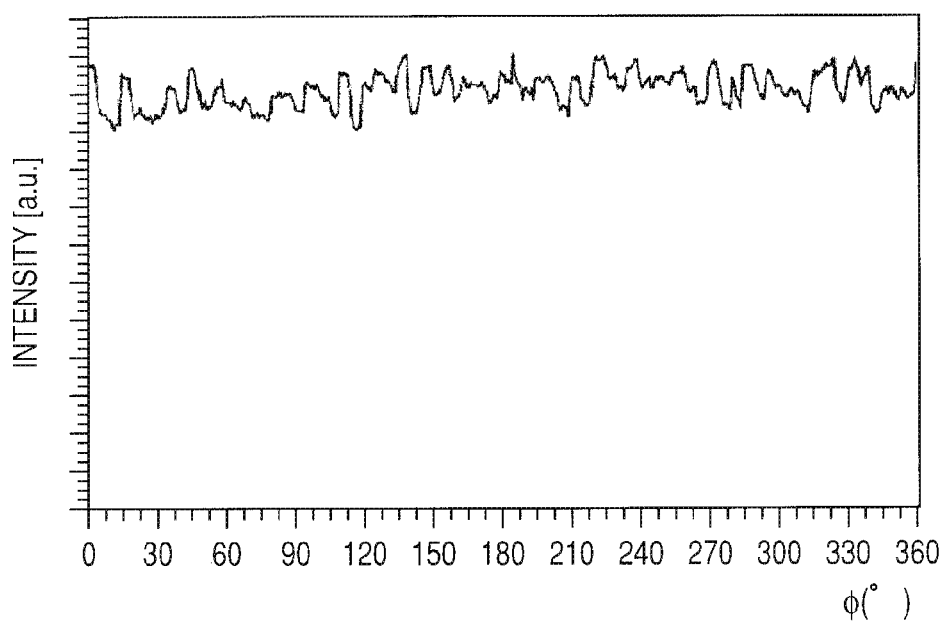
FIG. 13 is a graph illustrating the (101) plane φ scan measurement result of the metal oxynitride film in Comparative Example 1.

FIG. 13 illustrates a (101) plane $\phi$ scan measurement result for the ZnInON film obtained in Comparative Example 1.

Next, when the ZnInON film obtained in this Example 1 was observed with the atomic force microscope (AFM), the Rrms was 0.470 nm, depending on the composition.

On the other hand, the Rrms in Comparative Examples 1 and 2 was about 0.9 nm, and it was found that in the ZnInON film in this Example 1, a flat film was formed.

By laminating the ZnInON film on the GaN crystal layer in this manner, a substrate having excellent crystallinity and flatness can be provided. Also, the a-axis lattice constant of the ZnInON film in this Example 1 is larger than the lattice constant of ZnO, so that the substrate for growing a wurtzite-type crystal in this Example 1 can be used as, for example, a lattice-matched substrate for InGaN, InN and the like. Also, the ZnInON film in this Example 1 has low resistivity, so that there is an effect that a substrate also having an electrode function can be provided. Further, the above ZnInON can be formed by sputtering, so that an effect that the substrate can be provided at low cost can also be expected.

Example 2

ZnInON/GaN/$Al_2O_3$; Zn:In=31:18

In this Example, GaN was formed on a c-plane sapphire substrate by MOCVD, and then, a ZnInON film was formed by RF sputtering in an argon-nitrogen mixed atmosphere.

First, GaN was formed on the sapphire substrate by MOCVD. In this Example, annealing in a hydrogen atmosphere at 1150 degrees was performed as substrate pretreatment. Thus, high-quality GaN formed on the substrate is possible. It is known that in GaN growth, crystallinity in Ga polarity is higher than that in N polarity. This is because the GaN growth mode is in Ga polarity due to the pretreatment. The cause is not clear, but it is considered that the factor is that oxygen is reduced or etched by the pretreatment, so that the substrate surface is Al-richer than the stoichiometric ratio. Then, the substrate temperature was lowered to 470 degrees, and trimethylgallium (TMG) as the Ga raw material, and ammonia as the N raw material were flowed to form a 20 nm GaN low-temperature buffer layer.

Then, the temperature was raised to 1150° C., and TMG and ammonia were flowed as raw materials to grow a 5 μm high-temperature GaN layer.

When the high-temperature GaN is formed on the low-temperature buffer layer in this manner, with the buffer layer being as a nucleus, the nucleus coalesces, while growing laterally, during the formation of the high-temperature GaN, and finally, flat GaN can be obtained. Also, by the high-temperature GaN growing laterally, the threading dislocation is bent, and as a result, the dislocation density can be kept low.

When the GaN obtained by the above was observed with the atomic force microscope (AFM), the root mean square roughness (Rrms) was 0.258 nm Next, when the crystallinity was evaluated by X-ray diffraction, the rocking curve FWHM of (002) plane reflection was about 0.05 degree and was small, and it was found that high-quality (001)-oriented GaN was formed.

Also, when the detector was fixed at the diffraction position of the (101) plane, and in-plane orientation was measured by $\phi$ scan, the diffraction peak of the (101) plane was observed at intervals of 60 degrees, and it was found that in-plane orientation occurred. At this time, the FWHM of the diffraction peak obtained from the (101) plane $\phi$ scan was 0.15 degree.

Next, a ZnInON film was formed on the GaN. The manufacture of the ZnInON film was performed using the dual sputtering apparatus.

A two-inch sintered body having a ZnO composition and a two-inch sintered body having an In composition (each having a purity of 99.9%) were used as the targets (material sources). The input RF power was 65 W for ZnO, and 26 W for In. The distance between the targets and the substrate was about 12 cm, and the substrate temperature during film formation was 300° C. The ZnInON film was formed in an argon-nitrogen mixed gas atmosphere at $1 \times 10^{-1}$ Pa, and the partial pressure of the introduced nitrogen was $8 \times 10^{-2}$ Pa.

When the obtained ZnInON film was measured by the profilometer, the film thickness was 300 nm. The composition ratio of the ZnInON film measured by Rutherford backscattering (RBS) analysis was Zn:In:O:N=31:18:31:20 (unit:

atomic %). The RBS measurement precision was ±5%. Also, when the resistivity of the above ZnInON was evaluated by four-probe measurement, a value of 2 mΩcm was shown.

Comparative Example 3

ZnInON/Si (100), with Substrate Pretreatment

In this Comparative Example, a ZnInON film was formed on a Si (100) substrate. In this Comparative Example, the removal of the natural oxide film with hydrofluoric acid was performed as substrate pretreatment. The ZnInON film formation conditions were similar to those of the above Example 2.

When the obtained ZnInON film was measured by the profilometer, the film thickness was 300 nm. The composition ratio of the ZnInON film measured by RBS analysis was Zn:In:O:N=31:18:31:20 (unit: atomic %).

Comparative Example 4

ZnInON/Si (100), without Substrate Pretreatment

In this Comparative Example, a ZnInON film was formed on a Si (100) substrate. In this Comparative Example, substrate pretreatment was not performed. The ZnInON film formation conditions were similar to those of the above Example 2.

When the obtained ZnInON film was measured by the profilometer, the film thickness was 300 nm. The composition ratio of the ZnInON film measured by RBS analysis was Zn:In:O:N=31:18:31:20 (unit: atomic %).

(Crystallinity Evaluation)

When the two-dimensional X-ray diffraction pattern of the ZnInON films obtained in this Example 2 and Comparative Examples 3 and 4 was measured, a pattern similar to that of a (001)-oriented wurtzite-type structure was obtained for any of the ZnInON films, and it was found that the ZnInON films were crystals of wurtzite type. Also, by q–2q measurement (q: X-ray incident angle), it was found that the a-axis lattice constant was about 0.346 nm.

Next, the rocking curve of (002) plane reflection was measured for the ZnInON obtained in this Example 2. As a result, the FWHM was about 0.3 degree.

Figure 11:
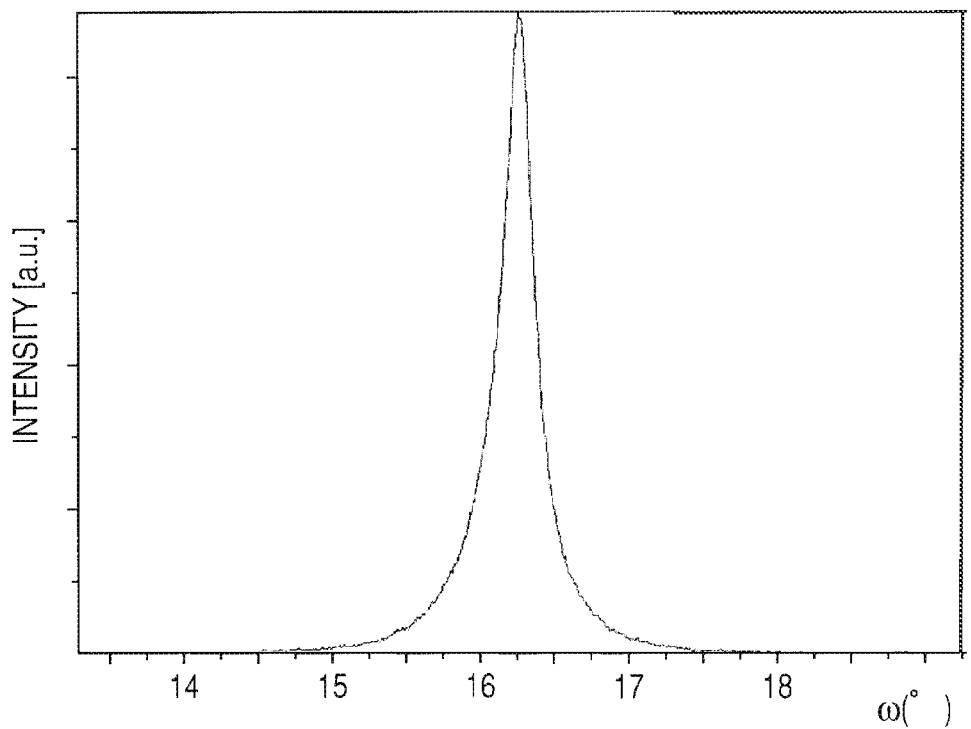
FIG. 11 illustrates the rocking curve of (002) plane reflection in the X-ray diffraction of a metal oxynitride film in Example 2.

FIG. 11 illustrates the rocking curve of (002) plane reflection obtained in this Example 2. On the other hand, when the rocking curve was measured for the ZnInON obtained in Comparative Examples 3 and 4, the FWHM of (002) plane reflection was about 5.5 degrees.

Also, when the detector was fixed at the diffraction position of the (101) plane of the ZnInON film in this Example, and in-plane orientation was measured by φ scan, the diffraction peak of the (101) plane was observed at intervals of 60 degrees, and it was found that in-plane orientation occurred. At this time, the FWHM of the diffraction peak obtained from the (101) plane φ scan was about 1.2 degrees. On the other hand, when the (101) plane φ scan measurement of the ZnInON films in Comparative Examples 3 and 4 was performed, diffraction was observed at any angle, without depending on φ, and it was found that in-plane orientation did not occur.

Next, when the ZnInON film obtained in this Example 2 was observed with the atomic force microscope (AFM), the Rrms was 0.590 nm, depending on the composition. On the other hand, the Rrms in Comparative Examples 3 and 4 was about 1.2 nm, and it was found that in the ZnInON film in this Example 2, a flat film was formed.

By laminating the ZnInON film on the GaN crystal layer in this manner, a substrate having excellent crystallinity and flatness can be provided. Also, the a-axis lattice constant of the ZnInON film in this Example 2 is larger than the lattice constant of ZnO, so that the substrate for growing a wurtzite-type crystal in this Example 2 can be used as, for example, a lattice-matched substrate for InGaN, InN and the like. Also, the ZnInON film in this Example 2 has low resistivity, so that there is the effect that a substrate also having an electrode function can be provided. Further, the above ZnInON can be formed by sputtering, so that the effect that the substrate can be provided at low cost can also be expected.

Example 3

ZnInON/GaN/Al$_2$O$_3$; Zn/In Composition Dependence

In this Example, GaN was formed on a c-plane sapphire substrate by MOCVD, and then, a ZnInON film was formed by RF sputtering in an argon-nitrogen mixed atmosphere.

First, GaN was formed on the sapphire substrate by MOCVD. In this Example, annealing in a hydrogen atmosphere at 1150 degrees was performed as substrate pretreatment. Thus, high-quality GaN formed on the substrate is possible. It is known that in GaN growth, crystallinity in Ga polarity is higher than that in N polarity. This is because the GaN growth mode is in Ga polarity due to the pretreatment. The cause is not clear, but it is considered that the factor is that oxygen is reduced or etched by the pretreatment, so that the substrate surface is Al-richer than the stoichiometric ratio.

Then, the substrate temperature was lowered to 470 degrees, and trimethylgallium (TMG) as the Ga raw material, and ammonia as the N raw material were flowed to form a 20 nm GaN low-temperature buffer layer.

Then, the temperature was raised to 1150° C., and TMG and ammonia were flowed as raw materials to grow a 5 μm high-temperature GaN layer.

When the high-temperature GaN is formed on the low-temperature buffer layer in this manner, with the buffer layer being as a nucleus, the nucleus coalesces, while growing laterally, during the formation of the high-temperature GaN, and finally, flat GaN can be obtained. Also, by the high-temperature GaN growing laterally, the threading dislocation is bent, and as a result, the dislocation density can be kept low.

When the GaN obtained by the above was observed with the atomic force microscope (AFM), the root mean square roughness (Rrms) was 0.258 nm.

Next, when the crystallinity was evaluated by X-ray diffraction, the rocking curve FWHM of (002) plane reflection was about 0.05 degree and was small, and it was found that high-quality (001)-oriented GaN was formed.

Also, when the detector was fixed at the diffraction position of the (101) plane, and in-plane orientation was measured by φ scan, the diffraction peak of the (101) plane was observed at intervals of 60 degrees, and it was found that in-plane orientation occurred. At this time, the FWHM of the diffraction peak obtained from the (101) plane φ scan was 0.15 degree.

Next, a ZnInON film was formed on the GaN. The manufacture of the ZnInON film was performed using a co-sputtering apparatus with diagonal incidence configuration. The targets were located obliquely to the substrate, and the composition of the film on the substrate surface was changed by a difference in distance from the targets. Therefore, thin films having various compositions can be obtained by changing the substrate position.

A two-inch sintered body having a ZnO composition and a two-inch sintered body having an In composition (each having a purity of 99.9%) were used as the targets (material sources). The input RF power was 74 W for ZnO, and 18 W for In. The distance between the targets and the substrate was about 10 to 15 cm, and the substrate temperature during film formation was 300° C. The ZnInON film was formed in an argon-nitrogen mixed gas atmosphere at $1 \times 10^{-1}$ Pa, and the partial pressure of the introduced nitrogen was $8 \times 10^{-2}$ Pa.

When the obtained ZnInON film was measured by the profilometer, the film thickness was 300 nm. The atomic composition ratio of Zn represented by Zn/(Zn+In), measured by X-ray fluorescence analysis, was 10 to 90 atomic %. Also, it was confirmed by X-ray photoelectron spectroscopy (XPS) analysis that the atomic composition ratio of N represented by N/(N+O) was 8 atomic % or more. Also, when the resistivity of the above ZnInON was evaluated by four-probe measurement, a value of 1 to 10 mΩcm was shown, depending on the composition.

Comparative Example 5

ZnInON/Si (100), with Substrate Pretreatment

In this Comparative Example, a ZnInON film was formed on a Si (100) substrate. In this Comparative Example, the removal of the natural oxide film with hydrofluoric acid was performed as substrate pretreatment. The ZnInON film formation conditions were similar to those of the above Example 3.

When the obtained ZnInON film was measured by the profilometer, the film thickness was 300 nm The atomic composition ratio of Zn represented by Zn/(Zn+In), measured by X-ray fluorescence analysis, was 10 to 90 atomic %.

Also, it was confirmed by X-ray photoelectron spectroscopy (XPS) analysis that the atomic composition ratio of N represented by N/(N+O) was 8 atomic % or more.

Comparative Example 6

ZnInON/Si (100), without Substrate Pretreatment

In this Comparative Example, a ZnInON film was formed on a Si (100) substrate. In this Comparative Example, substrate pretreatment was not performed. The ZnInON film formation conditions were similar to those of the above Example 3.

When the obtained ZnInON film was measured by the profilometer, the film thickness was 300 nm.

Also, by X-ray fluorescence analysis, the atomic composition ratio of Zn represented by Zn/(Zn+In) was 10 to 90 atomic %.

Also, it was confirmed by X-ray photoelectron spectroscopy (XPS) analysis that the atomic composition ratio of N represented by N/(N+O) was 8 atomic % or more.

(Crystallinity Evaluation)

When the two-dimensional X-ray diffraction pattern of the ZnInON films obtained in this Example 3 and Comparative Examples 5 and 6 was measured, a pattern similar to that of a (001)-oriented wurtzite-type structure was obtained for any of the ZnInON films, so that the ZnInON films were crystals of wurtzite type.

Also, a change in lattice constant depending on the composition ratio of the constituent elements was observed, and it was found that the a-axis lattice constant changed from about 0.330 nm to 0.358 nm FIG. 10 illustrates the a-axis lattice constant of the ZnInON films at different Zn/(In+Zn) composition ratios (atomic %). FIG. 10 is the result of the ZnInON films in this Example 3, and a similar result was obtained for both Comparative Examples 5 and 6.

Next, the rocking curve of (002) plane reflection was measured for the ZnInON obtained in this Example 3. As a result, the FWHM was about 0.09 to 0.5 degree, depending on the composition. On the other hand, when the rocking curve was measured for the ZnInON obtained in Comparative Examples 5 and 6, the FWHM of (002) plane reflection was 3 to 6 degrees.

Also, when the detector was fixed at the diffraction position of the (101) plane of the ZnInON film in this Example, and in-plane orientation was measured by φ scan, the diffraction peak of the (101) plane was observed at intervals of 60 degrees for any composition, and in-plane orientation occurred. At this time, the FWHM of the diffraction peak obtained from the (101) plane φ scan was about 0.5 to 1.5 degrees, depending on the composition. On the other hand, when the (101) plane φ scan measurement of the ZnInON films in Comparative Examples 5 and 6 was performed, diffraction was observed at any angle, without depending on φ, and it was found that in-plane orientation did not occur.

Next, when the ZnInON film obtained in this Example 3 was observed with the atomic force microscope (AFM), the Rrms was 0.440 nm to 0.650 nm, depending on the composition. On the other hand, the Rrms in Comparative Examples 5 and 6 was about 0.8 to 1.5 nm, and it was found that in the ZnInON film in this Example 3, a flat film was formed.

By laminating the ZnInON film on the GaN crystal layer in this manner, a substrate having excellent crystallinity and flatness can be provided. Particularly, the lattice constant of the ZnInON film in this Example 3 is variable over a wide range, so that the substrate for growing a wurtzite-type crystal in this Example 3 can be used as, for example, a lattice-matched substrate for InGaN, InN and the like. Also, the ZnInON film in this Example 3 has low resistivity, so that there is the effect that a substrate also having an electrode function can be provided. Further, the above ZnInON can be formed by sputtering, so that the effect that the substrate can be provided at low cost can also be expected.

Example 4

ZnGaON/GaN/Al$_2$O$_3$; Zn:Ga=24:24

In this Example, GaN was formed on a c-plane sapphire substrate by MOCVD, and then, a ZnGaON film was formed by RF sputtering in an argon-nitrogen mixed atmosphere.

First, GaN was formed on the sapphire substrate by MOCVD. In this Example, annealing in a hydrogen atmosphere at 1150 degrees was performed as substrate pretreatment. Thus, high-quality GaN formed on the substrate is possible. It is known that in GaN growth, crystallinity in Ga polarity is higher than that in N polarity. It is considered that this is because the GaN growth mode is in Ga polarity due to the pretreatment. Also, this is caused by the fact that oxygen is reduced or etched by the pretreatment, so that the substrate surface is Al-richer than the stoichiometric ratio.

Then, the substrate temperature was lowered to 470 degrees, and trimethylgallium (TMG) as the Ga raw material, and ammonia as the N raw material were flowed to form a 20 nm GaN low-temperature buffer layer.

Then, the temperature was raised to 1150° C., and TMG and ammonia were flowed as raw materials to grow a 5 μm high-temperature GaN layer.

When the high-temperature GaN is formed on the low-temperature buffer layer in this manner, with the buffer layer being as a nucleus, the nucleus coalesces, while growing laterally, during the formation of the high-temperature GaN, and finally, flat GaN can be obtained. Also, by the high-temperature GaN growing laterally, the threading dislocation is bent, and as a result, the dislocation density can be kept low.

When the GaN obtained by the above was observed with the atomic force microscope (AFM), the root mean square roughness (Rrms) was 0.258 nm Next, when the crystallinity was evaluated by X-ray diffraction, the rocking curve FWHM of (002) plane reflection was about 0.05 degree and was small, and it was found that high-quality (001)-oriented GaN was formed.

Also, when the detector was fixed at the diffraction position of the (101) plane, and in-plane orientation was measured by ϕ scan, the diffraction peak of the (101) plane was observed at intervals of 60 degrees, and it was found that in-plane orientation occurred. At this time, the FWHM of the diffraction peak obtained from the (101) plane ϕ scan was 0.15 degree.

Next, a ZnGaON film was formed on the GaN. The formation of the ZnGaON film was performed using the dual sputtering apparatus.

A 2-inch sintered body having a ZnO composition and a 2-inch sintered body having a GaN composition (each having a purity of 99.9%) were used as the targets (material sources). The input RF power was 69 W for ZnO, and 23 W for GaN. The distance between the targets and the substrate was about 12 cm, and the substrate temperature during film formation was 300° C. The ZnGaON film was formed in an argon-nitrogen mixed gas atmosphere at $1\times10^{-1}$ Pa, and the partial pressure of the introduced nitrogen was $8\times10^{-2}$ Pa. When the obtained ZnGaON film was measured by the profilometer, the film thickness was 300 nm. The composition ratio of the ZnGaON film measured by RBS analysis was Zn:Ga:O:N=24:23:28:25 (unit: atomic %). The RBS measurement precision was ±5%.

Comparative Example 7

ZnGaON/Si (100)

In this Comparative Example, a ZnGaON film was formed on a Si (100) substrate. The ZnGaON film formation conditions were similar to those of the above Example 4.

When the obtained ZnGaON film was measured by the profilometer, the film thickness was 300 nm. The composition ratio of the ZnGaON film measured by RBS analysis was Zn:Ga:O:N=24:23:28:25 (unit: atomic %).

(Crystallinity Evaluation)

When the two-dimensional X-ray diffraction pattern of the ZnGaON films obtained in this Example 4 and Comparative Example 7 was measured, a pattern similar to that of a (001)-oriented wurtzite-type structure was obtained for any of the ZnGaON films, and it was found that the ZnGaON films were crystals of wurtzite type. Also, a change in lattice constant depending on the composition ratio of the constituent elements was observed, and the a-axis lattice constant was about 0.328 nm Next, the rocking curve of (002) plane reflection was measured for the ZnGaON obtained in this Example 4. As a result, it was found that the FWHM was about 0.2 degree.

Figure 14:
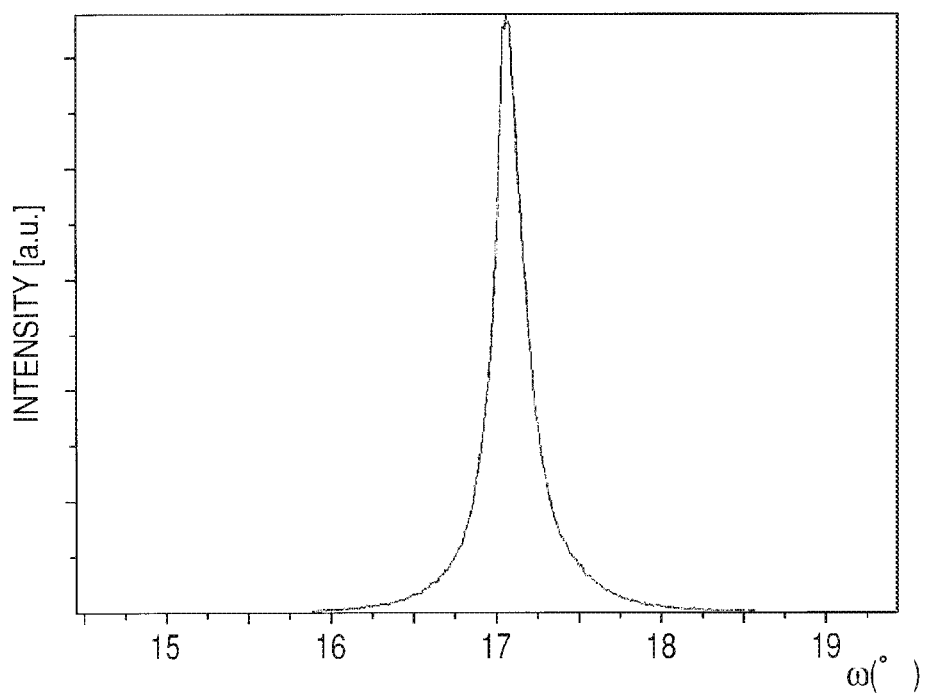
FIG. 14 illustrates the rocking curve of (002) plane reflection in the X-ray diffraction of a metal oxynitride film in Example 4.

FIG. 14 illustrates the rocking curve of (002) plane reflection. On the other hand, when the rocking curve was measured for the ZnGaON obtained in Comparative Example 7, the FWHM of (002) plane reflection was about 5 degrees.

Also, when the detector was fixed at the diffraction position of the (101) plane of the ZnGaON film in this Example, and in-plane orientation was measured by ϕ scan, the diffraction peak of the (101) plane was observed at intervals of 60 degrees, and it was found that in-plane orientation occurred. At this time, the FWHM of the diffraction peak obtained from the (101) plane ϕ scan was about 0.53 degree.

Figure 15:
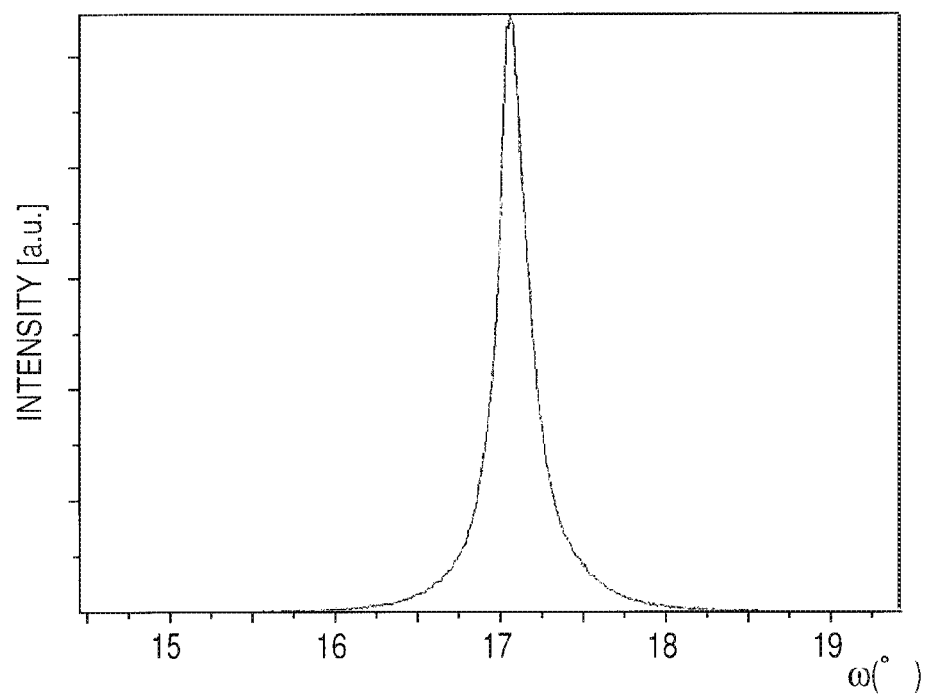
FIG. 15 is a graph illustrating the (101) plane φ scan measurement result of the metal oxynitride film in Example 4.

FIG. 15 illustrates the measurement result of the (101) plane ϕ scan. On the other hand, when the (101) plane ϕ scan measurement of the ZnGaON film in Comparative Example 7 was performed, diffraction was observed at any angle, without depending on ϕ, and it was found that in-plane orientation did not occur.

By laminating the ZnGaON film on the GaN crystal layer in this manner, a substrate having excellent crystallinity can be provided. Also, the a-axis lattice constant of the ZnGaON film in this Example 4 is larger than the lattice constant of ZnO, so that the substrate for growing a wurtzite-type crystal in this Example 4 can be used as, for example, a lattice-matched substrate for InGaN and the like. Also, the above ZnGaON can be formed by sputtering, so that there is the effect that the substrate can be provided at low cost.

Example 5

ZnGaON/GaN/Al$_2$O$_3$; Zn/Ga Composition Dependence

In this Example, GaN was formed on a c-plane sapphire substrate by MOCVD, and then, a ZnGaON film was formed by RF sputtering in an argon-nitrogen mixed atmosphere.

First, GaN was formed on the sapphire substrate by MOCVD. In this Example, annealing in a hydrogen atmosphere at 1150 degrees was performed as substrate pretreatment. Thus, high-quality GaN formed on the substrate is possible. It is known that in GaN growth, crystallinity in Ga polarity is higher than that in N polarity. It is considered that this is because the GaN growth mode is in Ga polarity due to the pretreatment. Also, this is caused by the fact that oxygen is reduced or etched by the pretreatment, so that the substrate surface is Al-richer than the stoichiometric ratio.

Then, the substrate temperature was lowered to 470 degrees, and trimethylgallium (TMG) as the Ga raw material, and ammonia as the N raw material were flowed to form a 20 nm GaN low-temperature buffer layer.

Then, the temperature was raised to 1150° C., and TMG and ammonia were flowed as raw materials to grow a 5 μm high-temperature GaN layer.

When the high-temperature GaN is formed on the low-temperature buffer layer in this manner, with the buffer layer being as a nucleus, the nucleus coalesces, while growing laterally, during the formation of the high-temperature GaN, and finally, flat GaN can be obtained. Also, by the high-temperature GaN growing laterally, the threading dislocation is bent, and as a result, the dislocation density can be kept low.

When the GaN obtained by the above was observed with the atomic force microscope (AFM), the root mean square roughness (Rrms) was 0.258 nm.

Next, when the crystallinity was evaluated by X-ray diffraction, the rocking curve FWHM of (002) plane reflection was about 0.05 degree and was small, and it was found that high-quality (001)-oriented GaN was formed.

Also, when the detector was fixed at the diffraction position of the (101) plane, and in-plane orientation was measured by ϕ scan, the diffraction peak of the (101) plane was observed at intervals of 60 degrees, and it was found that in-plane orientation occurred. At this time, the FWHM of the diffraction peak obtained from the (101) plane φ scan was 0.15 degree.

Next, a ZnGaON film was formed on the GaN. The manufacture of the ZnGaON film was performed using the co-sputtering apparatus with diagonal incidence configuration. The targets were located obliquely to the substrate, and the composition of the film on the substrate surface was changed by a difference in distance from the targets. Therefore, thin films having various compositions can be obtained by changing the substrate position.

A 2-inch sintered body having a ZnO composition and a 2-inch sintered body having a GaN composition (each having a purity of 99.9%) were used as the targets (material sources). The input RF power was 69 W for ZnO, and 23 W for GaN. The distance between the targets and the substrate was about 10 to 15 cm, and the substrate temperature during film formation was 300° C. The ZnGaON film was formed in an argon-nitrogen mixed gas atmosphere at $1 \times 10^{-1}$ Pa, and the partial pressure of the introduced nitrogen was $8 \times 10^{-2}$ Pa.

When the obtained ZnGaON film was measured by the profilometer, the film thickness was 300 nm.

The atomic composition ratio of Zn represented by Zn/(Zn+Ga), measured by X-ray fluorescence analysis, was 10 to 90 atomic %. Also, it was confirmed by X-ray photoelectron spectroscopy (XPS) analysis that the atomic composition ratio of N represented by N/(N+O) was 10 atomic % or more.

Comparative Example 8

ZnGaON/Si (100)

In this Comparative Example, a ZnGaON film was formed on a Si (100) substrate. The ZnGaON film formation conditions were similar to those of the above Example 5.

When the obtained ZnGaON film was measured by the profilometer, the film thickness was 300 nm.

The atomic composition ratio of Zn represented by Zn/(Zn+Ga), measured by X-ray fluorescence analysis, was 10 to 90 atomic %. Also, it was confirmed by XPS analysis that the atomic composition ratio of N represented by N/(N+O) was 10 atomic % or more.

(Crystallinity Evaluation)

When the two-dimensional X-ray diffraction pattern of the ZnGaON films obtained in this Example 5 and Comparative Example 8 was measured, a pattern similar to that of a (001)-oriented wurtzite-type structure was obtained for any of the ZnGaON films, and it was found that the ZnGaON films were crystals of wurtzite type. Also, a change in lattice constant depending on the composition ratio of the constituent elements was observed, and it was found that the a-axis lattice constant changed from about 0.320 nm to 0.332 nm.

Next, the rocking curve of (002) plane reflection was measured for the ZnGaON obtained in this Example 5. As a result, it was found that the FWHM was about 0.15 to 0.62 degree, depending on the composition. On the other hand, when the rocking curve was measured for the ZnGaON obtained in Comparative Example 8, the FWHM of (002) plane reflection was about 4 to 6 degrees.

Also, when the detector was fixed at the diffraction position of the (101) plane of the ZnGaON film in this Example, and in-plane orientation was measured by φ scan, the diffraction peak of the (101) plane was observed at intervals of 60 degrees for any composition, and it was found that in-plane orientation occurred. At this time, the FWHM of the diffraction peak obtained from the (101) plane φ scan was about 0.35 to 1.4 degrees, depending on the composition. On the other hand, when the (101) plane φ scan measurement of the ZnGaON film in Comparative Example 8 was performed, diffraction was observed at any angle, without depending on φ, and it was found that in-plane orientation did not occur.

By laminating the ZnGaON film on the GaN crystal layer in this manner, a substrate having excellent crystallinity and lattice constant control can be provided. Also, the above ZnGaON can be formed by sputtering, so that there is the effect that the substrate can be provided at low cost.

Example 6

ZnInON/Al$_2$O$_3$; Zn:In=15:85

In this Example, a ZnInON film was formed on a c-plane Al$_2$O$_3$ crystal substrate by RF sputtering in an argon-nitrogen mixed atmosphere.

First, annealing of an Al$_2$O$_3$ crystal substrate in a hydrogen atmosphere at 1150 degrees was performed for 10 minutes as pretreatment.

Next, a ZnInON film was formed on the Al$_2$O$_3$ crystal. The manufacture of the ZnInON film was performed using a dual sputtering apparatus.

A 2-inch sintered body having a ZnO composition and a 2-inch sintered body having an In composition (each having a purity of 99.9%) were used as the targets (material sources). The input RF power was 70 W for ZnO, and 18 W for In. The distance between the targets and the substrate was about 12 cm, and the substrate temperature during film formation was 300° C. The ZnInON film was formed in an argon-nitrogen mixed gas atmosphere at $1 \times 10^{-1}$ Pa, and the partial pressure of the introduced nitrogen was $8 \times 10^{-2}$ Pa. When the obtained ZnInON film was measured by a profilometer, the film thickness was 30 nm. The atomic composition ratio of Zn represented by Zn/(Zn+In), measured by X-ray fluorescence analysis, was 85 atomic %. Also, it was confirmed by XPS analysis that the atomic composition ratio of N represented by N/(N+O) was about 14 atomic %. Also, when the resistivity of the above ZnInON was evaluated by four-probe measurement, a value of 300 Ωcm was shown.

(Crystallinity Evaluation)

When the two-dimensional X-ray diffraction pattern of the ZnInON films obtained in this Example 6 was measured, a pattern similar to that of a (001)-oriented wurtzite-type structure was obtained for any of the ZnInON films, and it was found that the ZnInON films were crystals of wurtzite type. Also, by q–2q measurement (q being the X-ray incidence angle), it was found that the a-axis lattice constant was about 0.334 nm.

Next, the rocking curve of (002) plane reflection was measured for the ZnInON obtained in this Example 6. As a result, the FWHM was about 1 degree.

Figure 16:
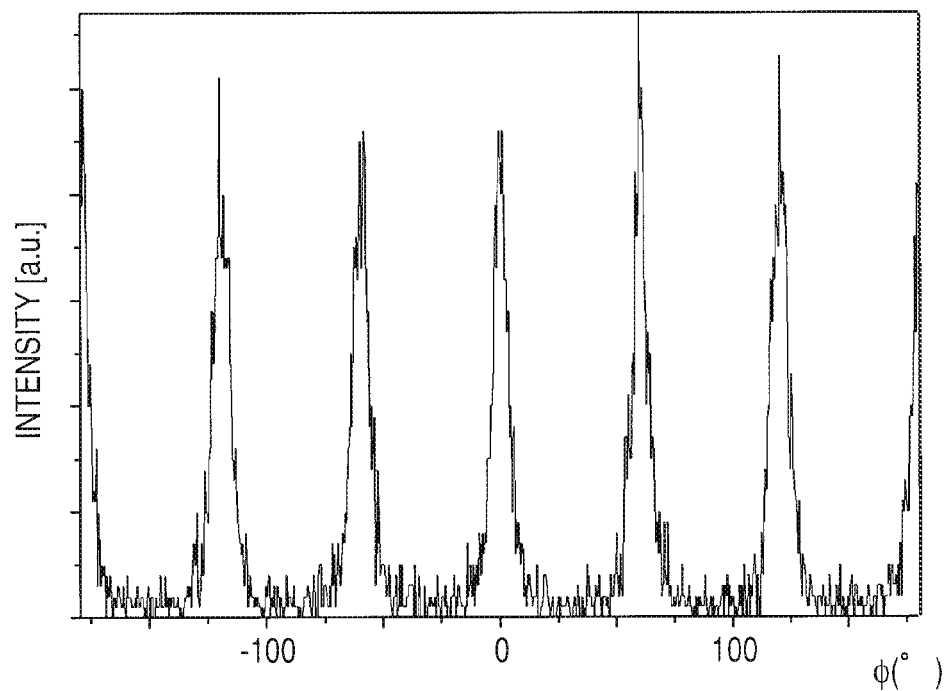
FIG. 16 is a graph illustrating the (101) plane φ scan measurement result of the metal oxynitride film in Example 6.

Also, when the detector was fixed at the diffraction position of the (101) plane of the ZnInON film in this Example, and in-plane orientation was measured by φ scan, the diffraction peak of the (101) plane was observed at intervals of 60 degrees, and in-plane orientation occurred. FIG. 16 illustrates the measurement result of the (101) plane φ scan obtained in this Example 6.

By laminating the ZnInON film on the Al$_2$O$_3$ crystal in this manner, a substrate having excellent crystallinity can be provided. Also, the a-axis lattice constant of the ZnInON film in this Example 6 is larger than the lattice constant of ZnO, so that the substrate for growing a wurtzite-type crystal in this Example 6 can be used as, for example, a lattice-matched substrate for InGaN, InN and the like. Also, the above ZnInON can be formed by sputtering, so that the effect that the substrate can be provided at low cost is expected.

Example 7

ZnInON/Al$_2$O$_3$; Zn:In=64:36

In this Example, a ZnInON film was formed on a c-plane Al$_2$O$_3$ crystal substrate by RF sputtering in an argon-nitrogen mixed atmosphere.

First, annealing of an Al$_2$O$_3$ crystal substrate in a hydrogen atmosphere at 1150 degrees was performed for 10 minutes as pretreatment.

Next, a ZnInON film was formed on the Al$_2$O$_3$. The manufacture of the ZnInON film was performed using a dual sputtering apparatus.

A 2-inch sintered body having a ZnO composition and a 2-inch sintered body having an In composition (each having a purity of 99.9%) were used as the targets (material sources). The input RF power was 80 W for ZnO, and 18 W for In. The distance between the targets and the substrate was about 12 cm, and the substrate temperature during film formation was 400° C. The ZnInON film was formed in an argon-nitrogen mixed gas atmosphere at $1\times10^{-1}$ Pa, and the partial pressure of the introduced nitrogen was $8\times10^{-2}$ Pa. When the obtained ZnInON film was measured by a profilometer, the film thickness was 40 nm. The atomic composition ratio of Zn represented by Zn/(Zn+In), measured by X-ray fluorescence analysis, was 64 atomic %. Also, it was confirmed by XPS analysis that the atomic composition ratio of N represented by N/(N+O) was about 35 atomic %. Also, when the resistivity of the above ZnInON was evaluated by four-probe measurement, a value of 1 mΩcm was shown.

(Crystallinity Evaluation)

When the two-dimensional X-ray diffraction pattern of the ZnInON films obtained in this Example 7 was measured, a pattern similar to that of a (001)-oriented wurtzite-type structure was obtained for any of the ZnInON films, and it was found that the ZnInON films were crystals of wurtzite type. Also, by q–2q measurement (q: X-ray incident angle), it was found that the a-axis lattice constant was about 0.341 nm Next, the rocking curve of (002) plane reflection was measured for the ZnInON obtained in this Example 7. As a result, the FWHM was about 1 degree.

Figure 17:
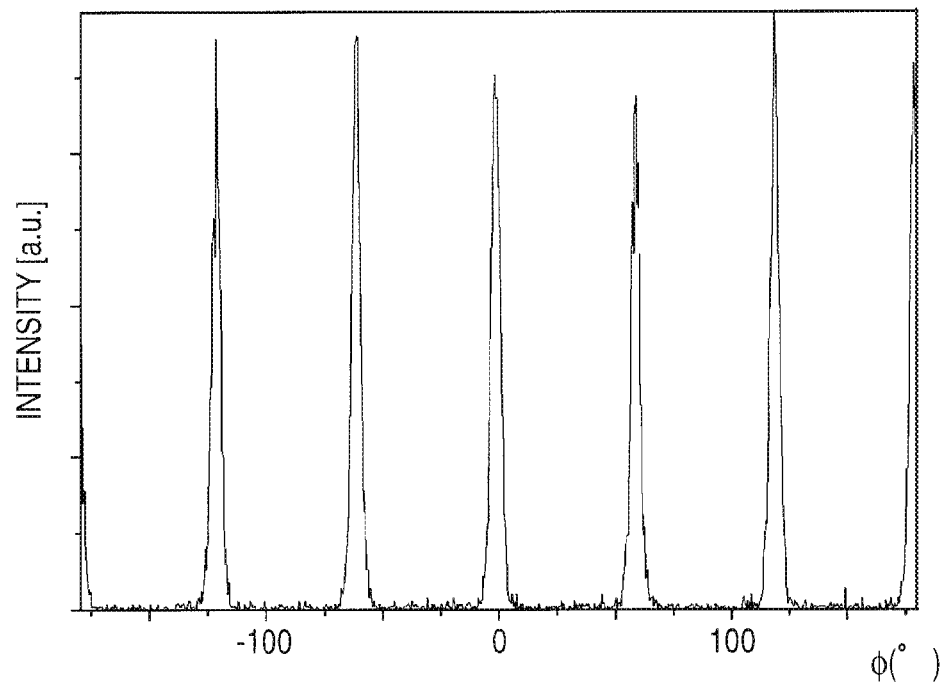
FIG. 17 is a graph illustrating the (101) plane φ scan measurement result of the metal oxynitride film in Example 7.

Also, when the detector was fixed at the diffraction position of the (101) plane of the ZnInON film in this Example, and in-plane orientation was measured by φ scan, the diffraction peak of the (101) plane was observed at intervals of 60 degrees, and in-plane orientation occurred. FIG. 17 illustrates the measurement result of the (101) plane φ scan obtained in this Example 7.

By laminating the ZnInON film on the Al$_2$O$_3$ crystal in this manner, a substrate having excellent crystallinity can be provided. Also, the a-axis lattice constant of the ZnInON film in this Example 7 is larger than the lattice constant of ZnO, so that the substrate for growing a wurtzite-type crystal in this Example 7 can be used as, for example, a lattice-matched substrate for InGaN, InN and the like. Also, the ZnInON film in this Example 7 has low resistivity, so that there is an effect that a substrate also having an electrode function can be provided. Also, the above ZnInON can be formed by sputtering, so that the effect that the substrate can be provided at low cost is expected.

Example 8

ZnInON/Al$_2$O$_3$; Zn:In=50:50

In this Example, a ZnInON film was formed on a c-plane Al$_2$O$_3$ crystal substrate by RF sputtering in an argon-nitrogen mixed atmosphere.

First, annealing of an Al$_2$O$_3$ crystal substrate in a hydrogen atmosphere at 1150 degrees was performed for 10 minutes as pretreatment. Then, another annealing in an ammonia atmosphere at 1150 degrees was performed.

Next, a ZnInON film was formed on the Al$_2$O$_3$ crystal. The manufacture of the ZnInON film was performed using a dual sputtering apparatus.

A two-inch sintered body having a ZnO composition and a two-inch sintered body having an In composition (each having a purity of 99.9%) were used as the targets (material sources). The input RF power was 60 W for ZnO, and 18 W for In. The distance between the targets and the substrate was about 12 cm, and the substrate temperature during film formation was 300° C. The ZnInON film was formed in an argon-nitrogen mixed gas atmosphere at $1\times10^{-1}$ Pa, and the partial pressure of the introduced nitrogen was $8\times10^{-2}$ Pa. When the obtained ZnInON film was measured by a profilometer, the film thickness was 30 nm. The atomic composition ratio of Zn represented by Zn/(Zn+In), measured by X-ray fluorescence analysis, was 50 atomic %. Also, it was confirmed by XPS analysis that the atomic composition ratio of N represented by N/(N+O) was about 14 atomic %. Also, when the resistivity of the above ZnInON was evaluated by four-probe measurement, a value of 1 mΩcm was shown.

(Crystallinity Evaluation)

When the two-dimensional X-ray diffraction pattern of the ZnInON films obtained in this Example 8 was measured, a pattern similar to that of a (001)-oriented wurtzite-type structure was obtained for any of the ZnInON films, and it was found that the ZnInON films were crystals of wurtzite type. Also, by q–2q measurement (q: X-ray incident angle), it was found that the a-axis lattice constant was about 0.350 nm Next, the rocking curve of (002) plane reflection was measured for the ZnInON obtained in this Example 8. As a result, the FWHM was about 1 degree.

Figure 18:
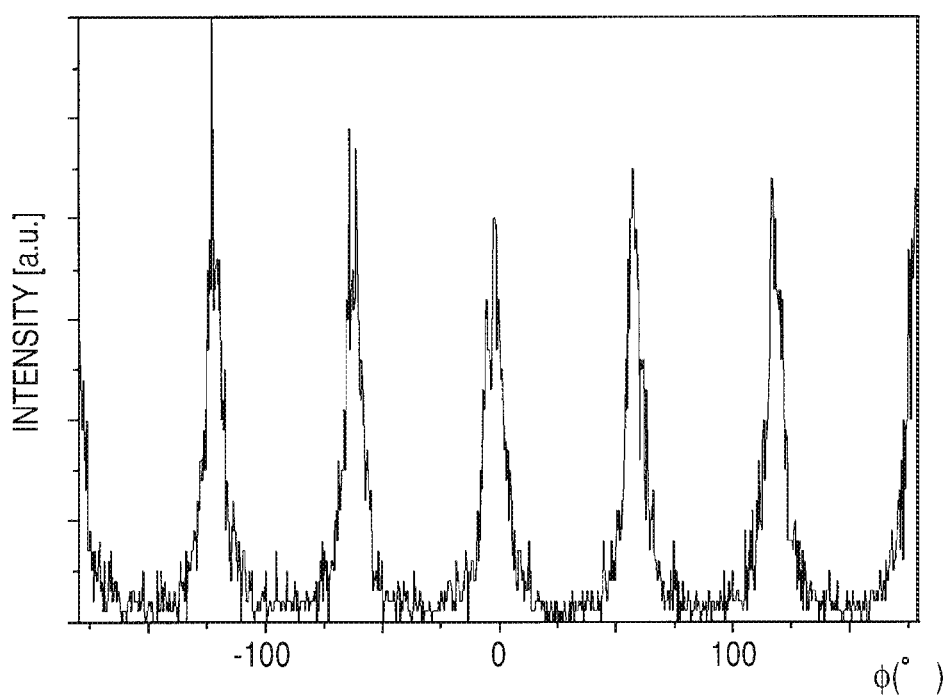
FIG. 18 is a graph illustrating the (101) plane φ scan measurement result of the metal oxynitride film in Example 8.

Also, when the detector was fixed at the diffraction position of the (101) plane of the ZnInON film in this Example, and in-plane orientation was measured by φ scan, the diffraction peak of the (101) plane was observed at intervals of 60 degrees, and in-plane orientation occurred. FIG. 18 illustrates the measurement result of the (101) plane φ scan obtained in this Example 8.

By laminating the ZnInON film on the Al$_2$O$_3$ crystal in this manner, a substrate having excellent crystallinity can be provided. Also, the a-axis lattice constant of the ZnInON film in this Example 8 is larger than the lattice constant of ZnO, so that the substrate for growing a wurtzite-type crystal in this Example 8 can be used as, for example, a lattice-matched substrate for InGaN, InN and the like. Also, the ZnInON film in this Example 8 has low resistivity, so that there is an effect that a substrate also having an electrode function can be provided. Also, the above ZnInON can be formed by sputtering, so that the effect that the substrate can be provided at low cost is expected.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-262931, filed Oct. 9, 2008, and Japanese Patent Application No. 2009-213725, filed Sep. 15, 2009, which are hereby incorporated by reference herein in their entirety.

What is claimed is:

1. A substrate comprising:
a sapphire substrate;
a first layer comprising a wurtzite-type crystal selected from the group consisting of GaN and ZnO, formed on said sapphire substrate; and
a second layer comprising a metal oxynitride crystal formed on said first layer,
wherein said second layer comprises N, O, Zn and at least one element selected from the group consisting of In, Ga, Si, Ge and Al, as main elements, each of which is at least 5 atomic % with respect to the total number of atoms in said second layer, and
wherein said second layer has in-plane orientation.

2. The substrate according to claim 1, wherein said second layer is a crystal of wurtzite type.

3. The substrate according to claim 1, wherein an a-axis lattice constant of said second layer is within the range of 0.320 nm to 0.358 nm.

4. The substrate according to claim 1, wherein an FWHM of an X-ray rocking curve of a (002) plane of said second layer is 1 degree or less.

5. The substrate according to claim 1, wherein said second layer comprises $Zn_{(x)}In_{(1-x)}O_{(y)}N_{(1-y)}$ wherein $0.1 \leq x \leq 0.9$ and $0.1 \leq y \leq 0.9$.

6. The substrate according to claim 1, wherein said second layer comprises $Zn_{(x)}Ga_{(1-x)}O_{(y)}N_{(1-y)}$ wherein $0.1 \leq x \leq 0.9$ and $0.1 \leq y \leq 0.9$.

7. The substrate for growing a wurtzite-type crystal according to claim 1, wherein the first layer comprises a $Al_2O_3$ crystal, and wherein the second layer comprises $Zn_{(x)}In_{(1-x)}O_{(y)}N_{(1-y)}$ wherein $0.1 \leq x \leq 0.9$ and $0.1 \leq y \leq 0.9$.

8. The substrate for growing a wurtzite-type crystal according to claim 1, wherein the first layer comprises a $Al_2O_3$ crystal, and wherein the second layer comprises $Zn_{(x)}Ga_{(1-x)}O_{(y)}N_{(1-y)}$ wherein $0.1 \leq x \leq 0.9$ and $0.1 \leq y \leq 0.9$.

9. A semiconductor device using the substrate according to claim 1 as a substrate.

10. The substrate according to claim 1, wherein the substrate is for growing a wurtzite-type crystal.

* * * * *